(12) United States Patent
Evans et al.

(10) Patent No.: US 9,472,505 B2
(45) Date of Patent: Oct. 18, 2016

(54) DIE OR SUBSTRATE MARKING USING A LASER

(71) Applicant: Intel Corporation, Santa Clara, CA (US)

(72) Inventors: Frank Evans, Queen Creek, AZ (US); Shipeng Qiu, Chandler, AZ (US); Dhruv Bhate, Scottsdale, AZ (US); Sergei Voronov, Chandler, AZ (US); Tao Wang, Chengdu (CN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/104,210

(22) Filed: Dec. 12, 2013

(65) Prior Publication Data

US 2015/0171017 A1    Jun. 18, 2015

(51) Int. Cl.

| | |
|---|---|
| *B23K 26/00* | (2014.01) |
| *H01L 23/544* | (2006.01) |
| *H01L 21/3105* | (2006.01) |
| *B23K 26/06* | (2014.01) |
| *H01L 21/67* | (2006.01) |
| *B23K 26/36* | (2014.01) |

(52) U.S. Cl.
CPC ......... *H01L 23/544* (2013.01); *B23K 26/0626* (2013.01); *B23K 26/082* (2015.10); *B23K 26/362* (2013.01); *H01L 21/3105* (2013.01); *H01L 21/67282* (2013.01); *H01L 2223/5442* (2013.01); *H01L 2223/54406* (2013.01); *H01L 2223/54413* (2013.01); *H01L 2223/54433* (2013.01); *H01L 2924/0002* (2013.01)

(58) Field of Classification Search
CPC ................... H01L 21/32131; H01L 21/32136
See application file for complete search history.

(56) References Cited

U.S. PATENT DOCUMENTS

| | | | |
|---|---|---|---|
| 2003/0071020 A1* | 4/2003 | Hong et al. ............. | 219/121.69 |
| 2012/0211477 A1* | 8/2012 | Chacin ................. | B23K 26/026 |
| | | | 219/121.69 |
| 2013/0017668 A1* | 1/2013 | Lei et al. ...................... | 438/462 |
| 2013/0196455 A1* | 8/2013 | Shen et al. ........................ | 438/7 |

OTHER PUBLICATIONS

IBM, Chip Identification Writing System, Mar. 1985, US.*

* cited by examiner

*Primary Examiner* — Mohammad Choudhry
(74) *Attorney, Agent, or Firm* — Schwegman, Lundberg & Woessner, P.A.

(57) ABSTRACT

Apparatus, systems, and methods are provided to generate markings on the surface of a die or substrate. The markings represent information. The markings can be annealed onto the surface of the die or substrate using a laser. Another embodiment can use an out-of-focus laser beam to mark a solder resist material.

16 Claims, 2 Drawing Sheets

DIE OR SUBSTRATE MARKING USING A LASER

TECHNICAL FIELD

Embodiments of the invention relate generally to marking integrated circuit dies or substrates with a laser.

BACKGROUND

Traceability of electronic components during assembly may provide data to identify and evaluate portions of the assembly process. For example, electronic components may be labeled with unique serial numbers and product identification information. Electronic components may be labeled using laser markings on a variety of surfaces such as the top of substrates and back side of the die. However, due to increasingly crowded real estate on the tops of substrates, it is becoming difficult to adequately mark the substrates.

DETAILED DESCRIPTION

The following detailed description refers to the accompanying drawings that show, by way of illustration, details and embodiments in which the invention may be practiced. These embodiments are described in sufficient detail to enable those skilled in the art to practice embodiments of the present invention. Other embodiments may be utilized and structural, logical, and electrical changes may be made without departing from the scope of the inventive subject matter. The various embodiments disclosed herein are not necessarily mutually exclusive, as some embodiments can be combined with one or more other embodiments to form new embodiments. The following detailed description is, therefore, not to be taken in a limiting sense.

In the interest of adding additional functions to an ever smaller package, new integrated circuit (IC) packaging technologies are becoming top-side limited in terms of available real estate on the substrates. The substrates may be marked with product identification information and a unique serial number to be used in tracking the substrate. Additionally, in order to further reduce die size, solder resist thicknesses may be reduced in order to enable ever smaller solder ball pitches for die attach to a substrate. However, all of these efforts in reducing substrate and die sizes may produce a package that is difficult to mark with identifying information.

Marking the silicon die instead of or in addition to marking the substrate may allow a reduction in size of the substrate and provide additional real estate for marking. However, existing industry-standard silicon laser marking processes generate excessive silicon debris and leave a rough surface. For example, existing industry-standard silicon laser marking use a laser ablation process to generate a surface roughness in order to provide mark contrast that is used for readability. The ablation process creates relatively significant mark depth penetration into the silicon and generates silicon recast debris. This may cause assembly interaction issues with the substrate where the die surface is contacted as well as causing die crack failures.

At least some of these problems may be resolved by a laser-induced annealing method and/or an out-of-focus laser marking method to place markings directly onto a die surface. Additionally, implementing the out-of-focus laser marking process on solder resist material, contrast may be improved, thus improving readability.

Figure 1:
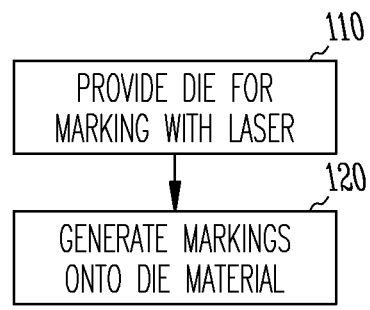
FIG. 1 illustrates a flowchart of an embodiment of a laser-induced annealing method to generate markings on a die or substrate.

FIG. 1 illustrates a flowchart of an embodiment of a laser-induced annealing method to generate markings on a die or substrate, where the markings are representative of information. In an embodiment, the die or substrate comprise silicon. Other embodiments may use other die or substrate materials.

The die or substrate are made up of a die material (e.g., silicon). The terms "die" and "die material" are interchangeable and may subsequently be used to refer to the die.

A die or substrate may be provided having a surface (e.g., topside) available for marking 110. The die or substrate may have one or more integrated circuits formed within it. The die may be attachable to a substrate. The substrate may be characterized as a three-dimensional structure having an effective length, effective width, and effective thickness, where the effective thickness is the smallest dimension. The integrated circuit may be mountable on a surface of the substrate.

Markings (e.g., alphanumeric characters, bar codes, images, icons) are generated on the surface of the die by a laser beam performing localized annealing at locations where the laser beam hits the die. These markings are representative of information (e.g., product information, unique serial number). Thus, the markings are annealed into the die or substrate material 120 instead of etched, as in typical methods. In another embodiment, the markings are made into a solder resist material on the substrate or die using an out-of-focus laser beam, as discussed subsequently. Another embodiment may combine these methods such that an out-of-focus laser beam is used to anneal the markings onto the die.

Annealing is a heat treatment that alters a material to increase its ductility and to make it more workable. The laser beam locally heats the die or substrate material to above its critical temperature, maintains a suitable temperature for a time, and then turns off to allow the die material to cool. For the purposes of marking the die or substrate, the annealing refines the structure of the die or substrate material, where the laser beam hits the die or substrate, by making the material homogeneous (e.g., altering the die material structure) and, thus, changing its appearance in those locations where the laser beam hits the material. This may have the effect of increasing the contrast between the locations where the laser beam hits the die material and the remainder of the die or substrate material. Since the annealing process does not remove any die material, the laser marking process may provide the benefit of not producing any debris. In an embodiment, the laser-induced annealing process resists creating any troughs on the surface that generate debris particles. In any event, laser-induce annealing changes the structure of the Si without forming any troughs and without leaving debris.

The laser-induced annealing process may use a spot-to-spot overlap of greater than or equal to 95%. This may be achieved with a laser having a frequency range of approximately greater than 40 kHz and a marking speed range of approximately 25-150 mm/s. The laser pulse energy may be in an approximate range of 18.3-21.7 micro-Joules (μJ). These criteria are for purposes of illustration as the present embodiments are not limited to any particular marking speeds, pulse energy, or spot-to-spot overlap.

Figure 2:
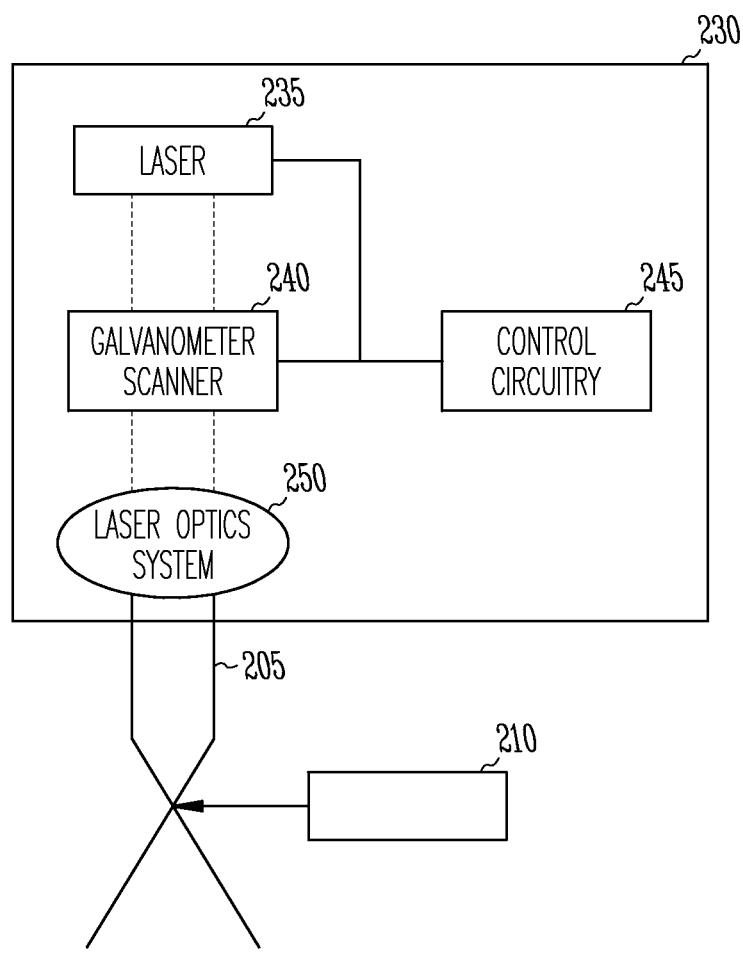
FIG. 2 illustrates a block diagram of an embodiment of a system to mark the die or substrate with the laser-induced annealing method.

FIG. 2 illustrates a block diagram of an embodiment of a system to mark a die or substrate using a laser-induced annealing process. The system 230 may include a laser 235, a galvanometer scanner 240, a laser optics system 250 (e.g., lens), and control circuitry 245. Movement of a laser beam 205, produced by the laser 235 and relative to a die or substrate 210, may be controlled by movement of a mirror portion of the galvanometer scanner 240 under the control of control circuitry 245. The control circuitry 245 may be used to control the localized contact of the laser beam 205 to the die 210 to anneal the desired markings onto the die or substrate 210. The control circuitry 245 may further control the laser, the laser optics system 250, and/or the galvanometer scanner in generation of the spot-to-spot overlap, the marking speed, the laser pulse energy as well as other marking criteria.

Any laser that may properly anneal the die or substrate material may be used. Such lasers may include, but are not limited to a Green Nd:YAG laser (wavelength of 532 nanometers (nm)) or an infrared laser (wavelength of 1062 nm). The beam diameter may be approximately 30 microns and a pulse width of greater than 20 nanoseconds (ns). The beam diameter may be varied by varying the above criteria for spot-to-spot overlap, laser pulse energy, and marking speed. Similarly, the type of laser may be varied by varying the above criteria.

Figure 3:
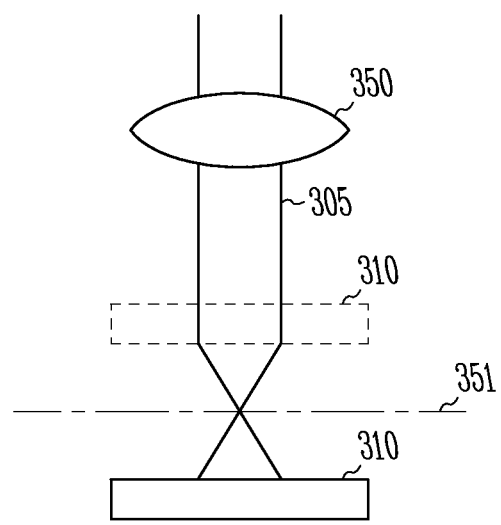
FIG. 3 illustrates an embodiment of an out-of-focus laser marking method for marking the die or substrate.

The embodiment of FIG. 2 illustrates the die or substrate 210 being marked while in the focal plane of the laser beam formed by the laser optics system 250. FIG. 3 illustrates an embodiment where the die or substrate 310 is marked outside of the focal plane 351 of the laser beam 350. Moving the die or substrate 310 outside of the focal plane 351 may enable the laser beam 350 to interact with the die or substrate material over a larger area, distributing the laser energy more uniformly throughout the mark spot area. This may result in a larger line width with increased contrast between the marked area and the unmarked area of the die or substrate. This, in turn, may result in improved readability of the markings.

FIG. 3 illustrates the laser beam 305 being prepared by a laser optics system 350 to a focal plane 351. The die or substrate 310 may be placed either above or below that focal plane 351. The movement of the laser beam 305 may be controlled to produce markings in the die or substrate 310 using substantially the same system 230 as FIG. 2. The laser may be an ultraviolet (UV) laser such as an excimer or other solid state laser (wavelength in a range of 126-351 nm). Other embodiments may use other wavelengths of laser (e.g., 126 nm to 1062 nm).

The die or substrate material being marked in the out-of-focus embodiment may include a layer of solder resist material (e.g., a polymer). Using a UV laser enables marking of relatively thin (e.g., <21 microns) solder resist material.

Moving the die or substrate 310 out of the focal plane 351 may be accomplished with various methods. The die or substrate may be moved or the focal plane may be moved. For example, the die or substrate 310 may be moved up or down out of the focal plane 351. Another embodiment may move the laser optics system 350 up or down to move the focal plane 351 up or down as desired. The control circuitry 245 may be used to control placement of the focal plane 351 by movement of the laser optics system 350 or by changing its focus.

The size and/or contrast of the markings made by the out-of-focus laser beam may be increased or decreased depending on how far out of the focal plane 351 the die or substrate is oriented. For example, moving the focal plane 351 further away from the die may increase the width of the beam hitting the die and, thus, the width of the marking. Moving the focal plane 351 closer to the die may decrease the width of the beam hitting the die and, thus, decrease the width of the marking.

Modern electronic apparatus and systems typically include many circuits integrated into one or more common material structures. Having circuits integrated into a common piece of material generally increases both reliability and the functionality provided in the single common piece of material, which are typically small. A single piece of material may include one or more integrated circuits that may or may not be coupled together in the material.

As used herein, a die, relative to integrated circuits, is a piece of material on which one or more given circuits may be formed. The piece of material may be a semiconducting piece of material. The piece of material may be an insulating piece of material in which conductive material and other insulating material constructing the integrated circuits are formed. Integrated circuits are generally formed in a batch process on a wafer.

The wafer is cut into many pieces after forming the integrated circuits, where each cut piece is a copy of the integrated circuit or circuits previously formed in the process. The cut piece is the die. It is not uncommon to refer to the die as an integrated circuit (IC), a chip, or a substrate. The wafer used to form the dies may be a silicon wafer. However, depending on the application for which the dies are fabricated, the wafer may be made of other materials such as, but not limited to, gallium arsenide, germanium, a semiconductor-on-insulator, sapphire, glass, and indium phosphide. Usually, the wafer may be selected based on quality of the selected material and various properties of the selected material, which may include using single crystal materials.

The die may be packaged for application in an apparatus or system. In assembly, the die is attached to a substrate and the substrate-die component may be packaged in a protective enclosure having electrical leads to access the integrated circuit(s) in the die from outside the packaging enclosure. The substrate-die combination may be viewed as a package. The substrate may be a semiconductor substrate or a substrate of other appropriate material.

Although specific embodiments have been illustrated and described herein, it will be appreciated by those of ordinary skill in the art that any arrangement that is calculated to achieve the same purpose may be substituted for the specific embodiments shown. It is to be understood that the above description is intended to be illustrative, and not restrictive, and that the phraseology or terminology employed herein is for the purpose of description. Combinations of the above embodiments and other embodiments will be apparent to those of skill in the art upon studying the above description.

EXAMPLES

Example 1 is a method for marking a surface, the method comprising: providing a die or substrate having the surface; and annealing markings onto the surface, the markings being representative of information.

In Example 2, the subject matter of Example 1 can optionally include wherein annealing the markings onto the surface comprises using a laser beam to anneal localized portions of the surface.

In Example 3, the subject matter of Examples 1-2 can optionally include wherein annealing the markings onto the surface comprises scanning a laser beam across the surface to alter the die or substrate structure in a localized fashion to form the markings.

In Example 4, the subject matter of Examples 1-3 can optionally include wherein annealing the markings onto the surface comprises annealing alphanumeric characters, bar codes, icons, and/or images onto the surface.

In Example 5, the subject matter of Examples 1-4 can optionally include wherein annealing the markings onto the surface comprises directing a laser using galvanometer scanners.

In Example 6, the subject matter of Examples 1-5 can optionally include wherein annealing the markings onto the surface comprises directing a laser using a greater than or equal to 95% spot-to-spot overlap.

In Example 7, the subject matter of Examples 1-6 can optionally include wherein directing the laser comprises using a laser frequency range of approximately greater than 40 kHz, a marking speed range of 25-150 mm/s, and a laser pulse energy range of 18.3 to 21.7 µJ.

In Example 8, the subject matter of Examples 1-7 can optionally include moving the die or substrate outside of a focal plane for a laser beam prior to annealing markings onto the surface.

Example 9 is a method for marking a surface, the method comprising: providing a die or substrate having the surface; generating a laser beam; focusing the laser beam to generate a focal plane; orienting the die or substrate in the laser beam outside of the focal plane such that the die or substrate is hit by an out-of-focus laser beam; and marking the surface with the out-of-focus laser beam, the markings being representative of information.

In Example 10, the subject matter of Example 9 can optionally include orienting the die or substrate in the laser beam outside of the focal plane comprises moving the die above or below the focal plane.

In Example 11, the subject matter of Examples 9-10 can optionally include wherein orienting the die in the laser beam outside of the focal plane comprises moving a laser optics system, for focusing the laser beam, such that the focal plane is above or below the die.

In Example 12, the subject matter of Examples 9-11 can optionally include wherein generating the laser beam comprises generating an ultraviolet, green, or infrared laser beam.

In Example 13, the subject matter of Examples 9-12 can optionally include wherein marking the surface comprises marking the surface that comprises a solder resist material or die.

In Example 14, the subject matter of Examples 9-13 can optionally include changing a width of the marking by moving the focal plane in relation to the die or substrate surface.

Example 15 is a die or substrate surface marking system comprising: a laser to generate a laser beam; a galvanometer scanner to scan the laser beam along the die or substrate surface; an optics system having a lens to focus the laser beam to a focal plane; and control circuitry to control the galvanometer scanner to anneal markings onto the surface of the die or substrate, the markings representative of information.

In Example 16, the subject matter of Example 15 can optionally include wherein the control circuitry includes circuitry to control the laser and/or the galvanometer scanner in spot-to-spot overlap, marking speed, or laser pulse energy.

In Example 17, the subject matter of Examples 15-16 can optionally include wherein the control circuitry includes circuitry to control movement of the focal plane such that the focal plane is above or below the die or substrate surface.

In Example 18, the subject matter of Examples 15-17 can optionally include wherein the laser generates a laser beam having a wavelength of 126 nanometers to 1062 nanometers, a beam diameter of 30 microns, and a pulse width greater than 20 nanoseconds.

In Example 19, the subject matter of Examples 15-18 can optionally include wherein the die or substrate comprises silicon or a solder resist material.

Example 20 is a die or substrate comprising: an integrated circuit coupled to the die; and markings on the die or substrate that have been annealed onto a surface of the die or substrate without leaving debris.

In Example 21, the subject matter of Example 20 can optionally include wherein the markings are representative of information including product information or unique serial number.

What is claimed is:

1. A method for marking a surface, the method comprising:
   providing a die or substrate having the surface;
   moving the die or substrate outside of a focal plane for a laser beam prior to annealing markings onto the surface; and
   annealing markings directly onto the surface, without ablation, while the die or substrate is outside of the focal plane for the laser beam, the markings being representative of information including alphanumeric characters, bar codes, images or icons;
   wherein a width of the markings is controlled by a distance of the die or substrate outside of the focal plane.

2. The method of claim 1 wherein annealing the markings onto the surface comprises using a laser beam to anneal localized portions of the surface.

3. The method of claim 1 wherein annealing the markings onto the surface comprises scanning a laser beam across the surface to alter the die or substrate structure in a localized fashion to form the markings.

4. The method of claim 1 wherein annealing the markings onto the surface comprises annealing alphanumeric characters, bar codes, icons, and/or images onto the surface.

5. The method of claim 1 wherein annealing the markings onto the surface comprises directing a laser using galvanometer scanners.

6. The method of claim 1 wherein annealing the markings onto the surface comprises directing a laser using a greater than or equal to 95% spot-to-spot overlap.

7. The method of claim 6 wherein directing the laser comprises using a laser frequency range of approximately greater than 40 kHz, a marking speed range of 25-150 mm/s, and a laser pulse energy range of 18.3 to 21.7 µJ.

8. A method for marking a surface, the method comprising:
   providing a die or substrate having the surface;
   generating a laser beam;
   focusing the laser beam to generate a focal plane;
   orienting the die or substrate in the laser beam outside of the focal plane such that the die or substrate is hit by an out-of-focus laser beam; wherein a width of markings made on the surface is controlled by a distance of the die or substrate outside of the focal plane; and directly marking the surface with the out-of-focus laser beam by an annealing of the surface without ablation while the die or substrate is outside of the focal plane, the markings being representative of information including alphanumeric characters, bar codes, images or icons.

9. The method of claim 8 wherein orienting the die or substrate in the laser beam outside of the focal plane comprises moving the die above or below the focal plane.

10. The method of claim 8 wherein orienting the die in the laser beam outside of the focal plane comprises moving a laser optics system, for focusing the laser beam, such that the focal plane is above or below the die or substrate.

11. The method of claim 8 wherein generating the laser beam comprises generating an ultraviolet, green, or infrared laser beam.

12. The method of claim 11 wherein marking the surface comprises marking the surface that comprises a solder resist material or die.

13. A die or substrate surface marking system comprising:
a laser to generate a green, infrared, or ultraviolet laser beam;
a galvanometer scanner to scan the laser beam along the die or substrate surface;
an optics system having a lens to focus the laser beam to a focal plane; and
control circuitry to control the galvanometer scanner to anneal markings directly onto the surface of the die or substrate without ablation, the markings comprising alphanumeric characters, bar codes, images, and/or icons and wherein the control circuitry includes circuitry to control a width of the markings in response to movement of the focal plane such that the focal plane is above or below the die or substrate surface.

14. The die or substrate surface marking system of claim 13 wherein the control circuitry includes circuitry to control the laser and/or the galvanometer scanner in spot-to-spot overlap, marking speed, or laser pulse energy.

15. The die or substrate surface marking system of claim 13 wherein the laser generates a laser beam having a wavelength of 126 nanometers to 1062 nanometers, a beam diameter of 30 microns, and a pulse width greater than 20 nanoseconds.

16. The die or substrate surface marking system claim 13 wherein the die or substrate comprises silicon or a solder resist material.

* * * * *